United States Patent
Tamura

[19]

[11] Patent Number: 6,080,003
[45] Date of Patent: Jun. 27, 2000

[54] MULTI-STAGE INTERCONNECTION TYPE ELECTRONIC COMPONENT WITH MOVABLE HOOK GUIDE MEMBER AND ELECTRONIC EQUIPMENT HAVING THE PLURAL MODULES

[75] Inventor: Tetsuya Tamura, Tokyo, Japan

[73] Assignee: NEC Corporation, Tokyo, Japan

[21] Appl. No.: 09/055,224

[22] Filed: Apr. 6, 1998

[30] Foreign Application Priority Data

Apr. 18, 1997 [JP] Japan .................................. 9-102137

[51] Int. Cl.⁷ .................................................. H01R 13/625
[52] U.S. Cl. .......................................... 439/347; 439/928.1
[58] Field of Search .................................. 439/345, 347, 439/310, 157, 717, 928, 928.1

[56] References Cited

U.S. PATENT DOCUMENTS

| | | | |
|---|---|---|---|
| 3,425,025 | 1/1969 | Williams | 439/347 |
| 4,501,460 | 2/1985 | Sisler | 439/347 |
| 4,969,830 | 11/1990 | Daly et al. | 439/136 |
| 5,897,400 | 4/1999 | Amberg et al. | 439/717 |
| 5,928,014 | 7/1999 | Sawayanagi et al. | 439/157 |

FOREIGN PATENT DOCUMENTS

| | | |
|---|---|---|
| 59-77286 | 5/1984 | Japan . |
| 64-13191 | 1/1989 | Japan . |
| 1-112798 | 5/1989 | Japan . |
| 1-218097 | 8/1989 | Japan . |
| 1-244697 | 9/1989 | Japan . |
| 1-293598 | 11/1989 | Japan . |
| 1-173979 | 12/1989 | Japan . |
| 2-147445 | 6/1990 | Japan . |
| 3-5650 | 1/1991 | Japan . |
| 4-350995 | 12/1992 | Japan . |
| 6-29176 | 4/1994 | Japan . |
| 7-283550 | 10/1995 | Japan . |
| 8-221154 | 8/1996 | Japan . |
| 9-100816 | 4/1997 | Japan . |

*Primary Examiner*—Khiem Nguyen
*Attorney, Agent, or Firm*—Young & Thompson

[57] ABSTRACT

In an electronic equipment including a plurality of modules which are connected together, each module contains an electronic component. A first module of the plurality of modules has a first engaging portion, and a second module of the plurality of modules includes a module body and a movable portion which is movable in relation to the module body. The movable portion is provided with a second engaging portion which is engaged with the first engaging portion of the first module in response to movement of the movable portion in relation to the module body.

20 Claims, 9 Drawing Sheets

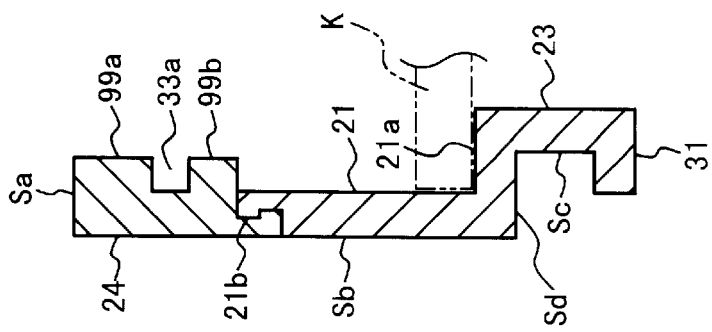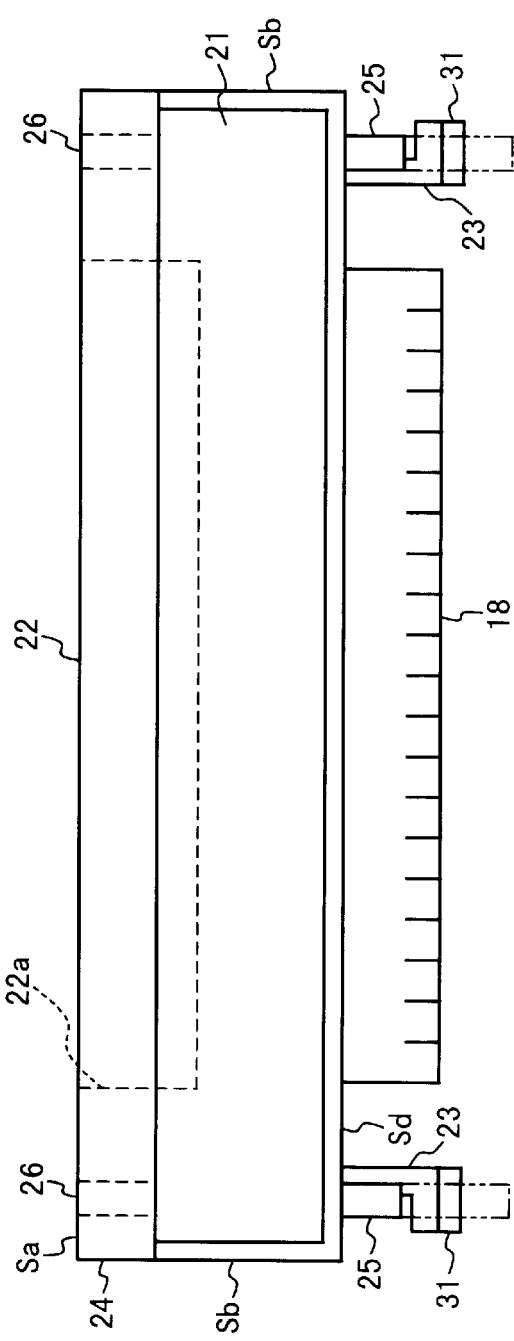

MULTI-STAGE INTERCONNECTION TYPE ELECTRONIC COMPONENT WITH MOVABLE HOOK GUIDE MEMBER AND ELECTRONIC EQUIPMENT HAVING THE PLURAL MODULES

BACKGROUND OF THE INVENTION

1. Field of the Invention

The present invention relates to a multi-stage interconnection type electronic component module with a movable hook guide member and an electronic equipment composed of a plurality of such modules. More particularly, the present invention relates to such a module adapted to facilitate alignment in interconnection of the modules and an electronic equipment.

2. Description of the Related Art

FIG. 1 shows a conventional compact size electronic equipment, for example, a personal computer. As shown in FIG. 1, a personal computer 51 is composed of a plate-shaped base frame 52. A plurality of circuit boards 53 are mounted with circuit components. The personal computer is further composed of a floppy disc drive 54, a hard disc drive 55, a power supply 56, an extension cage component 57 which allows an extension board or boards to be inserted therein and other functional components 58. A metallic or synthetic resin casing 59 is attached to surround the base frame 52.

In this kind of personal computer 51, all of the circuit boards 53 and various functional components 58 are mechanically connected to the base frame 52 directly or indirectly through interposed parts. For the mechanical connection, screws, bolts, nuts or snap fits of different shapes, sizes and materials or adhesives are used. On the other hand, for electrical connection, various connectors configured in conformity to the components to be connected are generally used.

By the way, there is a case where it becomes necessary to add a circuit component to the circuit boards, to add a new circuit board to the extension cage, or to add a drive for a different variety of storage medium, in order to make the personal computer 51 fit to an operator oriented application software. To facilitate the addition or replacement, coin screws which do not require a special tool are used to secure the casing 59 to the base frame 52. Also, an extension board is designed in such a manner that the extension board can be installed into the extension cage only by removing a lid which covers an opening of the cage.

With rapidly popularization of personal computers nowadays, cases for their maintenance necessarily increase. Also, the need for disassembly, assembly and addition of hardware as desired by users is increasing. Accordingly, it could be understood that it is primarily important at the present stage for such work to be further facilitated.

However, in the conventional example shown in FIG. 1, all of the circuit boards 53, functional components 58 and drives 54 and 55 are connected to the single base frame 52 and encased within the single casing 59. Accordingly, a more or less elaborate work is required to change a certain one of functional components 58, circuit boards 53 and drives 54 and 55 when a fault occurs. In such a case, the casing 59 must be first dismounted. Then, the component must be separated or a new component must be connected, while a number of connectors are discriminated from each other. Such a work may cause a mistake in recognizing a connector to be separated or connected.

In another aspect, there is the need to minimize the space requirement of the casing 59, because almost all of the personal computers are intended for desk-top use. If it is desired that a circuit board can be additionally mounted or demounted for version-up, it is necessary to provide a space reserved for the addition within the casing, since the conventional personal computer is covered within the single casing 59. However, there is a problem that the resulting size of the personal computer becomes larger than is necessary.

Japanese Laid-Open Patent Application (JP-A-Heisei 8-221154) proposes an approach to solve these problems, as illustrated in FIGS. 2, 3 and 4.

FIG. 2 is a perspective view of a compact size electronic equipment 42 including six units 43, 44, 45, 46, 47 and 48. FIG. 3 schematically shows the electric interconnection between the units 43 to 48. FIG. 4 is an exploded perspective view of a CPU unit 44 as a typical example of the units 43 to 48.

As shown in the figures, the compact size electronic equipment 42 is composed of the plurality of units 43 to 48, each of which contains circuit boards and functional components, and is accommodated within a functionally separate casing. Although the unit 44 will be described below, it could be understood that the description on the unit 44 may be also applied to remaining units 43 to 48.

Referring to FIG. 3, each of the units 43 to 48 includes common interfaces 50 for electric connection with a common system bus 49. As shown in FIG. 4, the unit 44 has a male connector 72 and a female connector 73 connected with the common interfaces 50. As illustrated in FIG. 2, the male connector 72 and the female connector 73 allow any of the units 43 to 48 to be electrically interconnected together when they are stacked one above another.

Referring to FIG. 4, the unit 44 is composed of a unit frame 64, a front panel 66 and a casing 67. Numeral 63 in FIG. 4 represents a CPU circuit board mounted on the unit frame 64. A user can easily assemble the unit frame 64, front panel 66 and casing 67 into the unit 44 without using any special tool. These members can also be disassembled. The male connector 72 and the female connector 73 are shown in broken line block in FIG. 4 and are mounted vertically on the back side of the unit frame 64.

The casing 67 of the unit 44 is provided with fixtures 75a and 75c which are used to secure the unit 44 to other units (not shown) which are arranged above and below the unit 44. The fixtures 75a and 75c are formed on side wall of the casing 67 in upper locations and lower locations. By moving the casing 67 relative to the casing of another unit, a mechanical connection is established between the fixtures 75a and 75c of the adjacent units, which are then coupled and secured together.

More specifically, the fixtures 75a are locking claws which are provided in the lower portion of each of the side walls of the casing 67 at three locations in order to secure units which are stacked one above another. The fixtures 75c are provided in the upper portion of each side wall of the casing 67 at three locations to correspond to the fixture. The fixture 75c is in the form of a hook such that the fixture 75c can be engaged with the corresponding locking claw 75a of the casing. A locking notch 75b is formed between the two fixtures 75c in each side wall of the casing 67.

Referring to FIG. 4, it should be noted that each locking claw 75a is located directly below the hook 75c in plan view. The locking notch 75b has a length greater than that of the locking claw 75a so as to receive the locking claw therein. To prevent a misalignment between two units when they are disposed one above another, an alignment guiding and hook section 74a is formed in the upper portion of the front panel 66 to receive an aligning dowel 74b which is formed on the bottom plate of the front panel 66 of the upper unit.

The case where a unit A having a casing 67A is installed on a unit B having a casing 67B will be described. In the following description, "A" and "B" are added to the reference numerals of the components for discrimination, respectively.

Initially, the front panel 66A and unit frame 64A of the unit A are assembled together. The casing 67A is also attached, but is not yet secured tightly and in a free state. On the other hand, the front panel 66B, the unit frame 64B and the casing 67B are assembled together.

Subsequently, the casing 67A of the unit A is slid backward of the casing 67B of the unit B. The aligning dowel 74bA of the coupled assembly of the unit A is then fitted into the aligning guiding and hook section 74aB of the coupled assembly of the unit B. The female connector 73B of the assembly of the unit B is mated with the male connector 72A of the assembly of the unit A. Then, the front panel 66A and the unit frame 64A of the unit A are put on the front panel 66B and the unit frame 64B of the unit B respectively.

Subsequently, each of six locking claws 75aA on the bottom of the casing 67A of the unit A is inserted into a corresponding one of six locking notches 75bB in the top of the casing 67B of the unit B. Now, sliding the casing 67A forward (toward the front panel 66A), each of the locking claws 75aA on the casing 67A may be brought below each of the hooks 75cB on the casing 67B. Thus, the locking claw 75aA is engaged with the hook 75cB so that the casings 67A are 67B are adjoined together. It could be understood that the sliding movement results in the engagement of the casing 67A with the unit A. The assembly of the unit A is already positioned relative to the unit B by the engagement between the aligning guiding and hook section 74aB and the aligning dowel 74bA. This completes the joining between the unit A and the unit B.

However, in this conventional technique, there is a problem in that the alignment cannot be established between the casings 67A of the unit A and the casing 67B of the unit B. Also, there is another problem in that workability is not good. Specifically, in the conventional technique, each of the locking claws 75aA of the casing 67A is inserted into a corresponding one of the locking notches 75bB in the casing 67B. Then, the casing 67A is slid in such a manner that each locking claw 75aA on the casing 67A is disposed below a corresponding one of the hooks 75cB of the casing 67B. This is because the locking claw 75a, locking notch 75b and hook 75c are formed in the side wall of the casing 67 with greatly reduced sizes. Therefore, the engaging operation is made difficult because of the space limitation. The entire casing 67 must be moved for alignment of the locking claw 75a and the hook, nevertheless the locking claw 75a is sufficiently small as compared with the overall size of the casing 67.

If the unit frame 64 and the casing 67 are formed integrally, the unit frame 64 hinders the locking claws 75a on the bottom of the casing 67. As a result, the engagement of the claws with the hooks 75c is made difficult. This requires that the unit frame 64 and the casing 67 should be formed as separate members, resulting in increase of the number of parts.

The connection between the male connector 72 and the female connector 73 is achieved only as a result of positioning of the assemblies through the engagement between the alignment guiding and hook section 74a and the alignment dowel 74b. As a result, a positional offset of electrodes or an insufficient pushing pressure is caused, resulting in poor contact.

Japanese Laid-Open Patent Application (JP-A-Heisei 2-147,445) discloses an apparatus for mounting and dismounting an onboard equipment. Specifically, the apparatus is composed of a rotatable handle, a sliding member slidably mounted on the body of the apparatus and driven by a free end of the handle, and a resilient member for urging the sliding member. The apparatus is further composed of a locking member connected to the sliding member for angular movement in response to a sliding operation of the sliding member, a mounting section having a cavity in which the apparatus is received, and an engaging element which is formed on the wall of the cavity and which is engaged with the locking member. In this conventional technique, the locking member is engaged with the engaging element, and the apparatus is secured to the mounting section. Also, the handle is turned to make the sliding member slide to disengage the locking member from the engaging element. Again, there is given no disclosure as to the construction to adjoining modules together and the detail of the alignment during the adjoining operation.

Japanese Laid-Open Patent Application (JP-A-Heisei 1-112,798) discloses an apparatus for mounting an electronic equipment. A mounting section is provided with a portion, against which one side of the electronic equipment abuts. The apparatus includes a member which urges the other side of the electronic equipment and a lever which drives the urging member toward or away from the equipment. Here, again, there is no disclosure as to the construction to adjoin modules together and the detail of the alignment during the adjoining operation.

Japanese Laid-Open Patent Application (JP-A-Heisei 7-283,550) discloses a technique in which an upper and a lower case can be secured together in a simple manner without using a screw. Thus, the efficiency of an assembling operation is improved. Also, the technique is described in which the removal of the lower case is simplified by the addition of a screw. Specifically, the upper case includes an engaging region which is composed of a backward inclined surface formed on an end face of a printed circuit board holder, and an engaging projection defined by the inclined surface on a front surface of the printed circuit board holder. The lower case includes an engaging region which is composed of a cantilevered resilient piece formed on the surface of the lower case, a projection formed on the resilient piece for detachably engaging the engaging projection, and a threaded bore formed in the resilient piece. When a screw is engaged with the threaded bore and then turned, the end of the screw is moved to be in contact with the inclined surface and is slid therealong, thereby moving the lower case relative to the upper case. However, no disclosure is found here as to the construction to adjoin modules together and the detail of the alignment during the adjoining operation.

Japanese Laid-Open Utility Model Application (JU-A-Showa 64-13,191) discloses a two stage structure for mounting circuit boards in which a first circuit board is mounted in full contact with a board mounting surface and a second circuit board is mounted on and spaced from the first circuit board. A circular opening is cut in the first circuit board, and a fastener provided with a rotary stopper is inserted into the opening. A spacer tube is fitted around the fastener and the second circuit board is then screwed as a second stage in the stack. Thus, both of the first and second circuit boards are coupled into a module. The first circuit board is then mounted on the board mounting plane. As before, there is no disclosure as to the construction to adjoin modules together and the detail of the alignment during the adjoin operation.

Japanese Laid-Open Patent Application (JP-A-Heisei 4-350,995) discloses a twist lock mechanism which dispenses with a screwing operation and which can be used with a human body detector as mounted on a ceiling or a wall. Specifically, a cover is peripherally provided with pawls. Also, an equipment is composed of an abutment, a resilient claw, and an unlock opening. The abutment is formed around the inner peripheral edge of a fitting hole which is engaged with a tongue of the cover. The resilient claw may be elastically deformed to a position, which allows a turning motion of the cover when the cover is mounted. However, but The resilient claw is elastically restored to a position where it blocks the turning motion of the cover after the tongue of the cover has gone into abutting engagement with the abutment. A tool such as a screwdriver may be inserted into the unlock opening when the cover is to be removed to cause an elastic deformation of the resilient claw to the position which allows the turning motion of the cover. However, there is no disclosure here as to the construction to adjoin modules together and the detail of the alignment during the adjoining operation.

Japanese Laid-Open Utility Model Application (JU-A-Heisei 3-5,650) discloses an apparatus for mounting and dismounting an onboard equipment in which an onboard equipment is secured to a sleeve-like case mounted on a vehicle. The onboard equipment is composed of a mounting/dismounting handle, a spring for urging the spring in one direction, and a lock plate which is moved integrally with the handle. A case includes a lock pin which is urged by the spring for rotation, and the lock plate is formed with a slit engaged with the pin and a tapered groove for disengaging the pin from the slit. When the onboard equipment is inserted into the case to a given position and the handle is then pushed, the pin on the onboard equipment is engaged with the slit in the lock plate of the case to lock the onboard equipment. When the handle is pushed again, the lock plate rotates to disengage the pin from the slit, thus unlocking the onboard equipment. No disclosure is given here as to the construction to adjoin modules together and the detail of the alignment during the adjoining operation.

Japanese Laid-Open Utility Model Application (JU-A-Showa 59-77,286) discloses a shaft having a groove cut thereinto diametrically and having opposite ends which are rotatably mounted in left and right panels which form a printed circuit board container. No disclosure is given here as to the construction to adjoin modules together and the details of the alignment during the adjoining operation.

Japanese Laid-Open Patent Application (JP-A-Heisei 1-244,697) discloses a mount having a portion which abuts against one side of an electronic equipment, the other side of which is urged by a member which is in turn driven in a direction toward or away from the equipment. No disclosure is found here as to the construction to adjoin modules together and the detail of the alignment during the adjoining operation.

Japanese Laid-Open Patent Application (JP-A-Heisei 1-218,097) discloses an arrangement including a handle supported by the body of an apparatus, a lock member rotatably carried by the body, a sliding member for driving the lock member for rotation, a rotating member connected to the sliding member and driving the handle, a mounting section having a cavity in which the body of the apparatus is received, and an engaging element formed on the wall of the mount and engageable by the lock member. When the lock member is engaged with the engaging element, the body of the apparatus is secured to the mount. When the sliding member is slid, the sliding member disengaged the lock member from the engaging element and the handle is driven by the rotating member. However, no disclosure is found here as to the construction to adjoin modules together and the detail of the alignment during the adjoining operation.

Finally, Japanese Laid-Open Patent Application (JP-A-Heisei 1-293,598) discloses a control board mounted on a rotatable support member, which is then stopped at an angle of rotation to reverse the control board so as to cause it to face forward. Again, no disclosure is found here as to the construction to adjoin modules together and the detail of the alignment during the adjoining operation.

SUMMARY OF THE INVENTION

The invention is made to solve the above problems in the conventional technique. Therefore, an object of the present invention is to provide an electronic equipment which facilitates interconnection between modules while suppressing poor contact between connectors and which has a reduced number of parts.

In order to achieve an aspect of the present invention, an electronic equipment including a plurality of modules which are connected together, each module containing an electronic component includes a first module of the plurality of modules which has a first engaging portion, and a second module of the plurality of modules which includes a module body and a movable portion which is movable in relation to the module body, wherein the movable portion is provided with a second engaging portion which is engaged with the first engaging portion of the first module in response to movement of the movable portion in relation to the module body.

The first engaging portion may be provided in one of upper and lower parts of the first module, and the second engaging portion may be provided in the other of the upper and lower parts of the second module in correspondence with the first engaging portion.

A plurality of such first engaging portions may be provided in the first module and a plurality of such second engaging portions may be provided in the second module.

At least one of the module body and the first module may be formed with a positioning section which positions the module body and the first module.

The first module may be formed with one of a convex portion and a concave portion corresponding to the convex portion, and the second module may be formed with the other of the convex portion and the concave portion. In this case, the convex portion may include of a convex connector connected to an electronic component and the concave portion may include a concave connector connected to another electronic component. Also, the convex portion may have an amount of projection such that at least part of the convex portion is inserted into the concave portion when the first module is not yet engaged with the movable portion. The convex connector may be pressed to the concave connector to establish electrical contact with each other when the first module is engaged with the movable portion, and may be separated from the concave connector to release the electrical connect. In addition, one of the first module and the second module on which the convex connector may be formed is provided with a projection portion having an amount of projection which is greater than that of the convex connector.

The movable portion may include a clearance portion into which the first engaging portion can be inserted in the movable portion, and the movable portion may be moved between a first state in which the first engaging portion is engaged with the second engaging portion and a second state in which the first engaging portion is disengaged from the second engaging portion when the first engaging portion of the first module is inserted into the clearance portion.

The movable portion may be provided with a positioning section which positions the first engaging portion at an engaged position with the second engaging portion.

The movable portion is provided with a guide section for guiding the first engaging portion between an engaged position with the second engaging portion and a disengaged position from the second engaging portion.

The first engaging portion may be formed with a first engaging surface which opposes the second engaging portions when the first engaging portion and the second engaging portion are engaged, and the second engaging portion is formed with a second engaging surface which opposes the second engaging portion when the first engaging portion and the second engaging portion are engaged. In this case, each of the first engaging surface and the second engaging surface is formed on a canted surface which progressively descends with the movement of the movable portion.

The first engaging portion may be formed with a first engaging surface which opposes the second engaging portion when the first engaging portion and the second engaging portion are engaged. The second engaging portion may be formed with a second engaging surface which opposes the first engaging portion when the first engaging portion and the second engaging portion are engaged. In this case, the first engaging portion is formed with a first surface which is substantially parallel to the first engaging surface on a back side of the first engaging surface, and the movable portion is formed with a second surface substantially parallel to the first surface of the first engaging portion when the second engaging portion and the first engaging portion are engaged.

The second surface on the movable portion may extend from a position facing the first surface when the first engaging portion is engaged with the second engaging portion to a position facing the first surface when the first engaging portion is disengaged from the second engaging portion.

A space between the second engaging surface and the second surface has a width which is progressively reduced with the movement of the movable portion relative to the module body.

The first engagement portion is formed with a first engaging surface which opposes the second engaging potion when the first engaging portion and the second engaging portion are engaged. The second engaging portion may be formed with a second engaging surface which opposes the first engaging portion when the first engaging portion and the second engaging portion are engaged. In this case, the movable portion is formed with a second surface which is substantially parallel to the second engaging surface and which defines, together with the second engaging surface, a clearance through which the first engaging portion can pass. A first surface is provided on a back side of the first engaging surface of the first engaging surface, and the first surface is formed such that a clearance formed between the first surface and the first engaging surface progressively increases its width with the relative movement of the movable portion relative to the module body such that engaging force is enhanced when the second engaging portion is engaged with the first engaging portion.

The first module may include a first module body and a first movable portion which is movable relative to the first module body, and the first engaging portion is provided on the first module body of the first module, so that the first movable portion on the first module is engageable with a third module.

In order to achieve another aspect of the present invention, a module engageable with another module includes a module body containing an electronic component and a movable portion which is movable relative to the module body, and an engaging portion provided on the movable portion and engageable with another engaging portion provided on the another module, the engaging portion being engageable with or disengageable from the other engaging portion on the other module as the movable portion moves relative to the module body.

In order to achieve still another aspect of the present invention, a method of assembling an electronic equipment including a plurality of modules interconnected together, each of the modules containing an electronic component (K), includes the steps of positioning a first module and a second module in the direction of a first surface; and causing a relative movement of all or a part of at least one of the first module and the second module relative to the other to position the first module and the second module in the direction of a second surface which is substantially orthogonal to the direction of the first surface, thereby interconnecting the first module and the second module.

BRIEF DESCRIPTION OF THE DRAWINGS

FIG. 7 is a front view of the multi-stage interconnection type electronic component module when being viewed from the direction shown in FIG. 5 by an arrow A;

FIG. 8 is a cross section of the multi-stage interconnection type electronic component module taken along the line B-B shown in FIG. 5;

DESCRIPTION OF THE PREFERRED EMBODIMENTS

A multi-stage interconnection type electronic component module with a slidable hook guide member of the present invention and an electronic equipment composed of a plurality of such modules now will be described with reference to the attached drawings.

Figure 1:
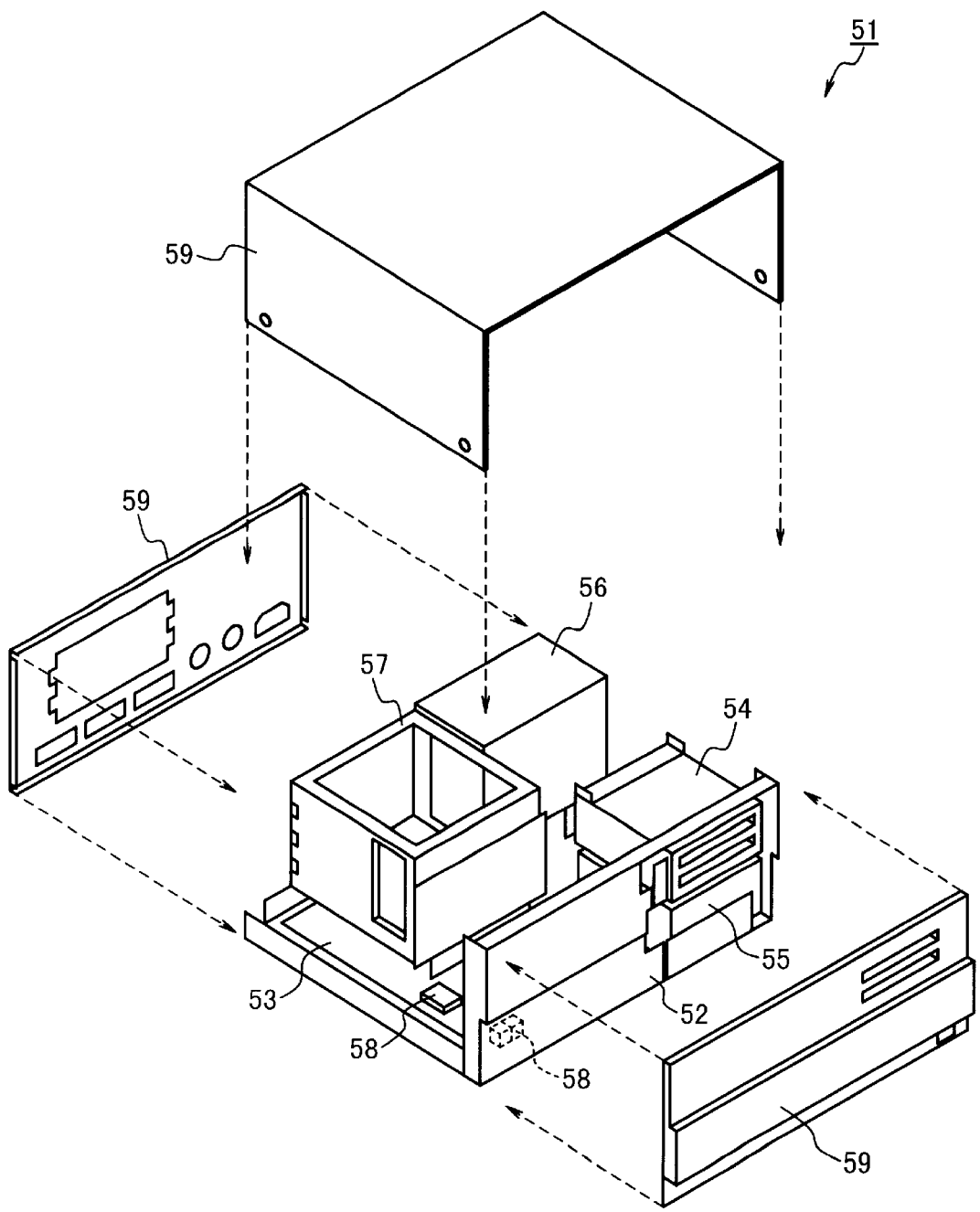
FIG. 1 is an exploded perspective view of a first conventional example of personal computer.
Figure 2:
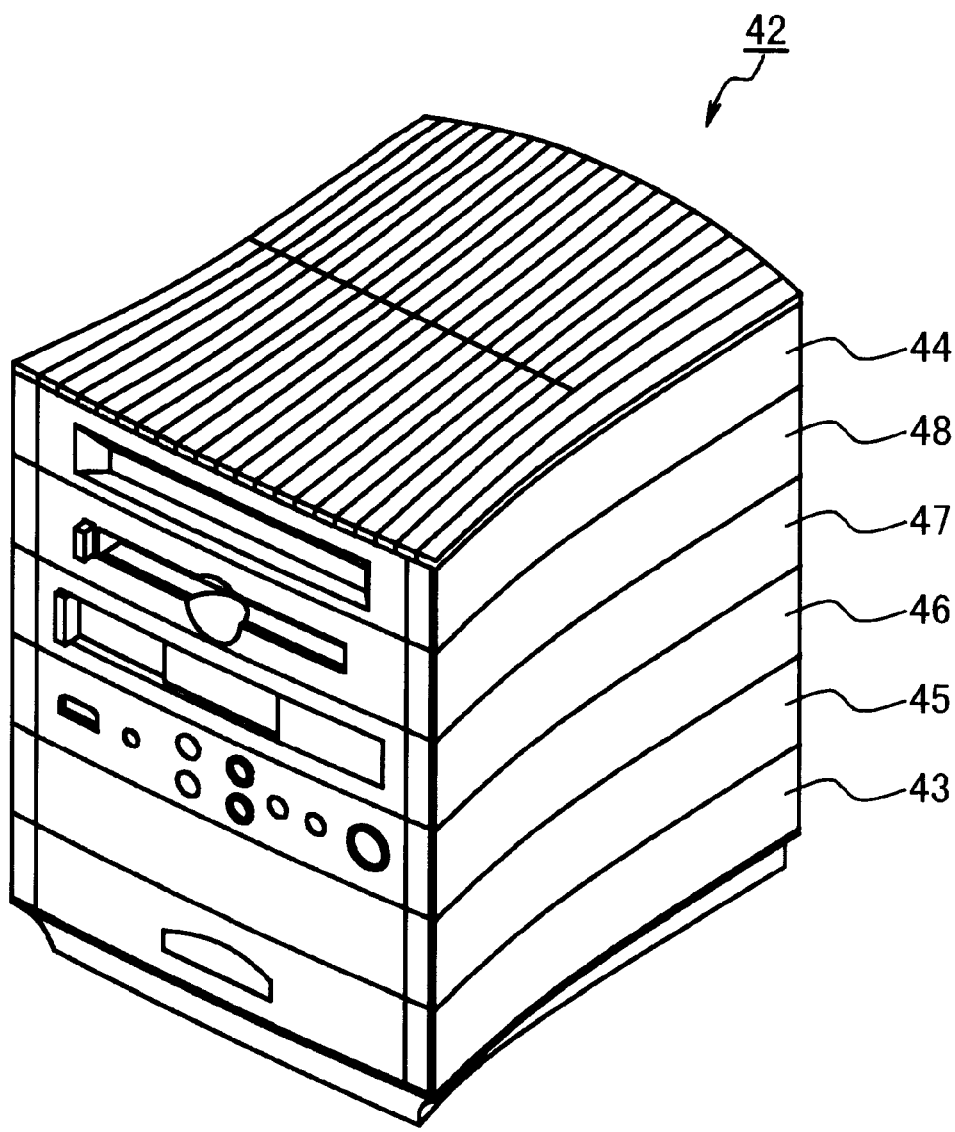
FIG. 2 is a perspective view of a second conventional example of personal computer including a plurality of units.
Figure 3:
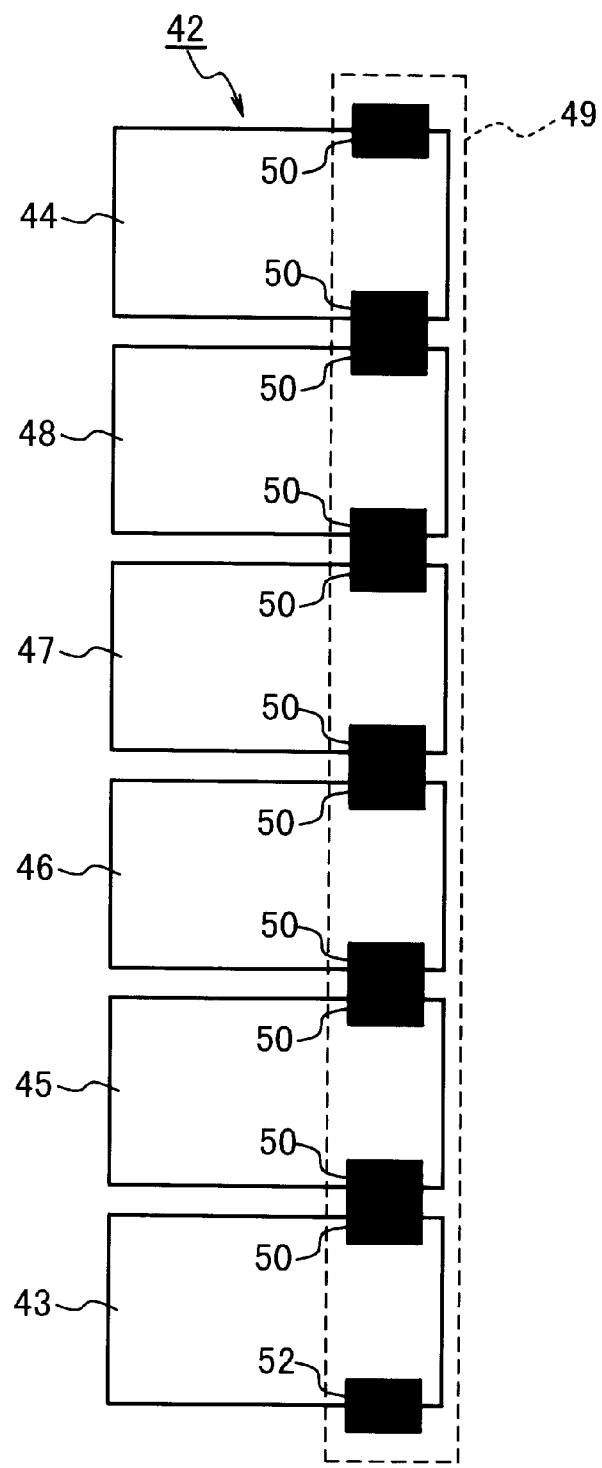
FIG. 3 is a schematic illustration of an electrical interconnection between the individual units in the personal computer of FIG. 2.
Figure 4:
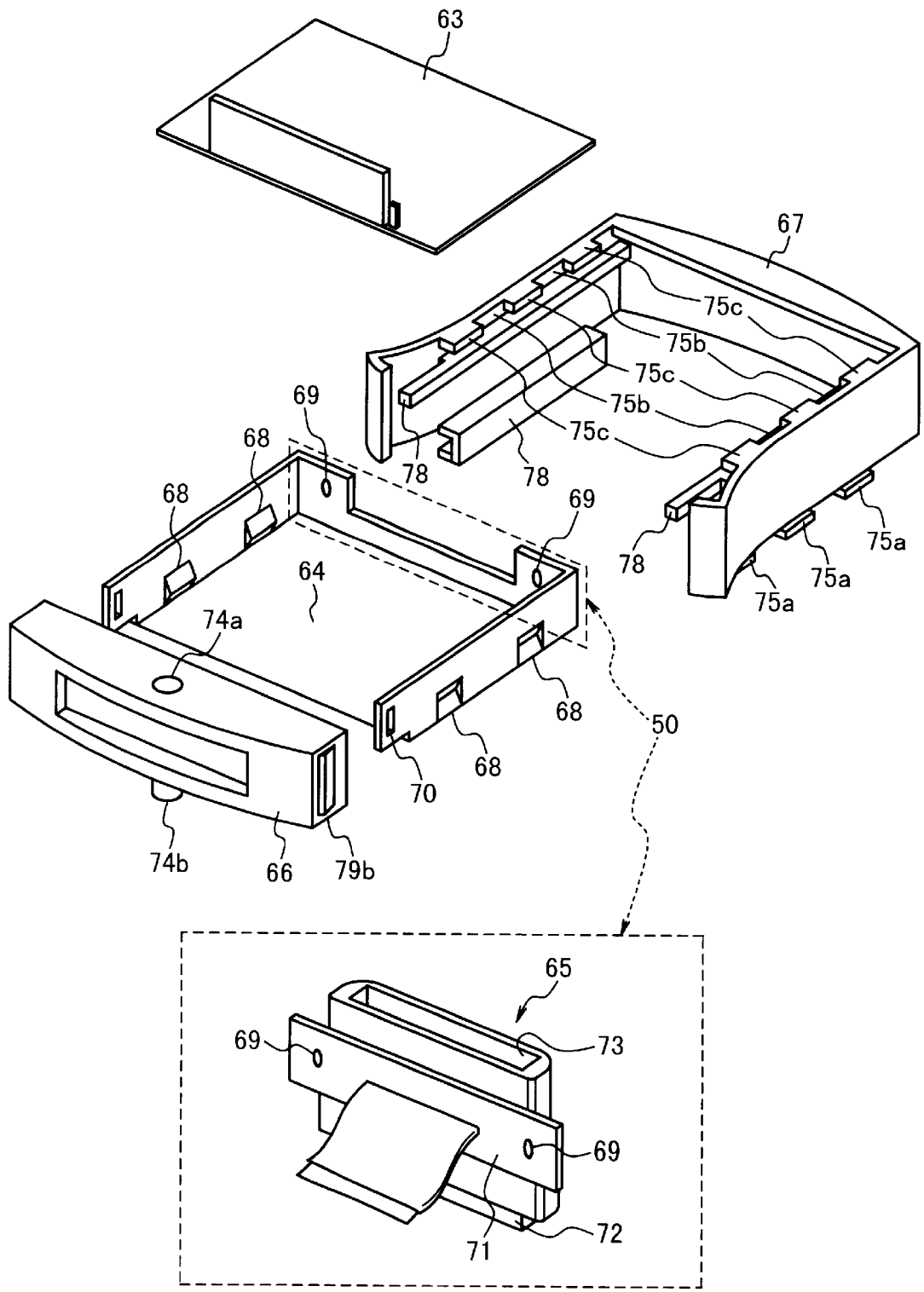
FIG. 4 is an exploded perspective view showing one example of units shown in FIG. 2.
Figure 5:
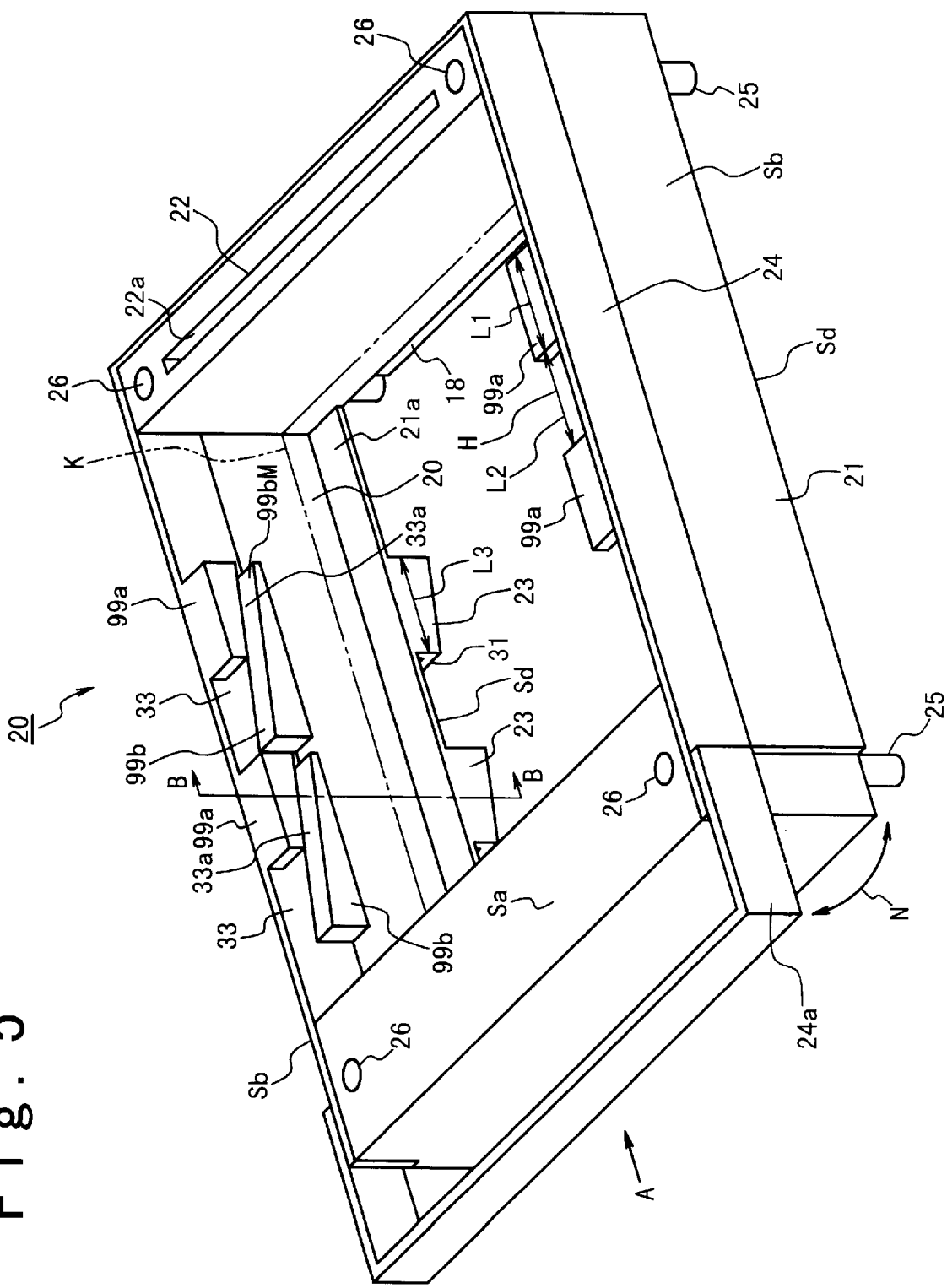
FIG. 5 is a perspective view of a multi-stage interconnection type electronic component module with a slidable hook guide member pulled forward of the module, according to the invention.
Figure 6:
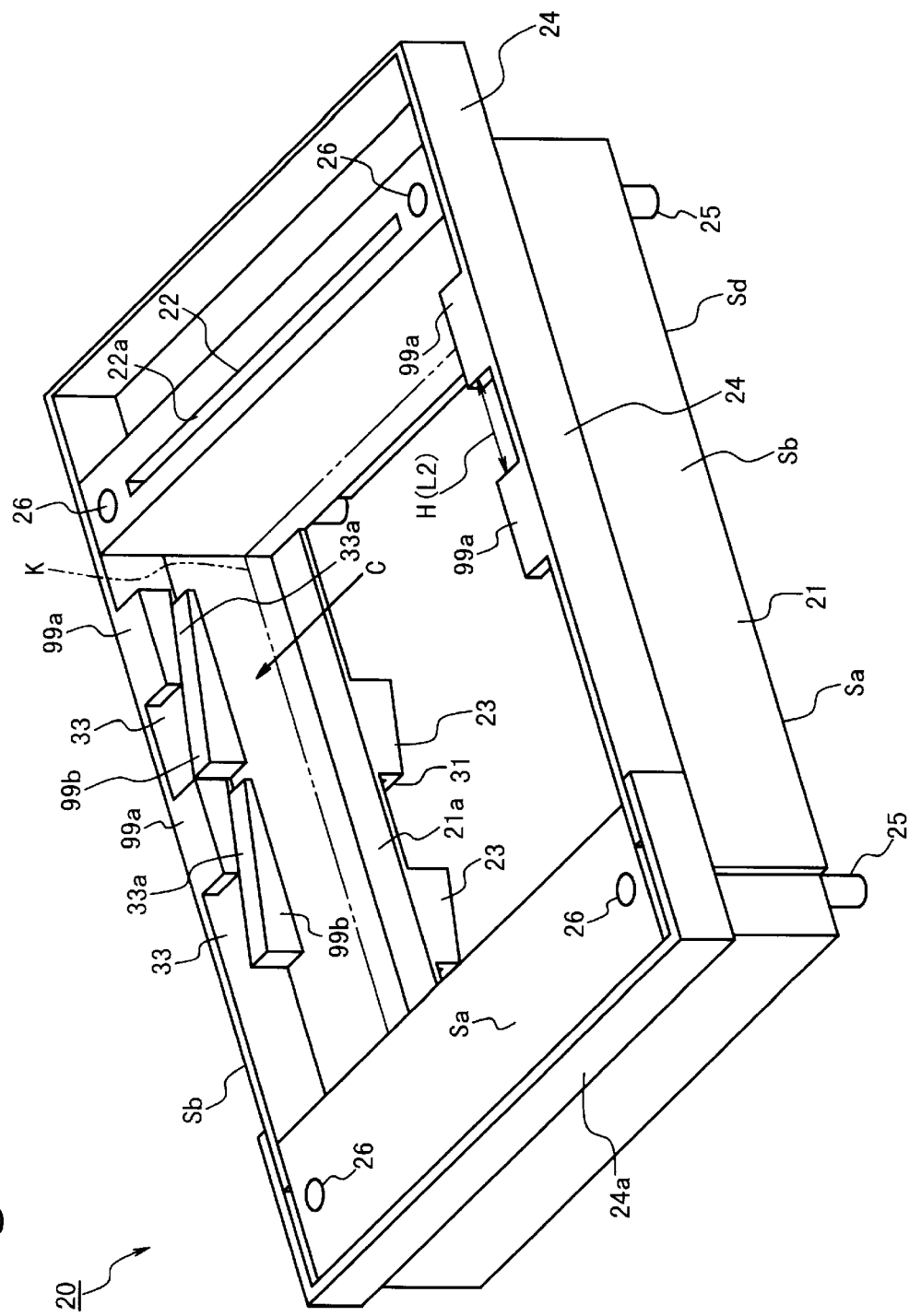
FIG. 6 is a perspective view of the multi-stage interconnection type electronic component module with the slidable hook guide member pushed backward of the module shown in FIG. 5.
Figure 9:
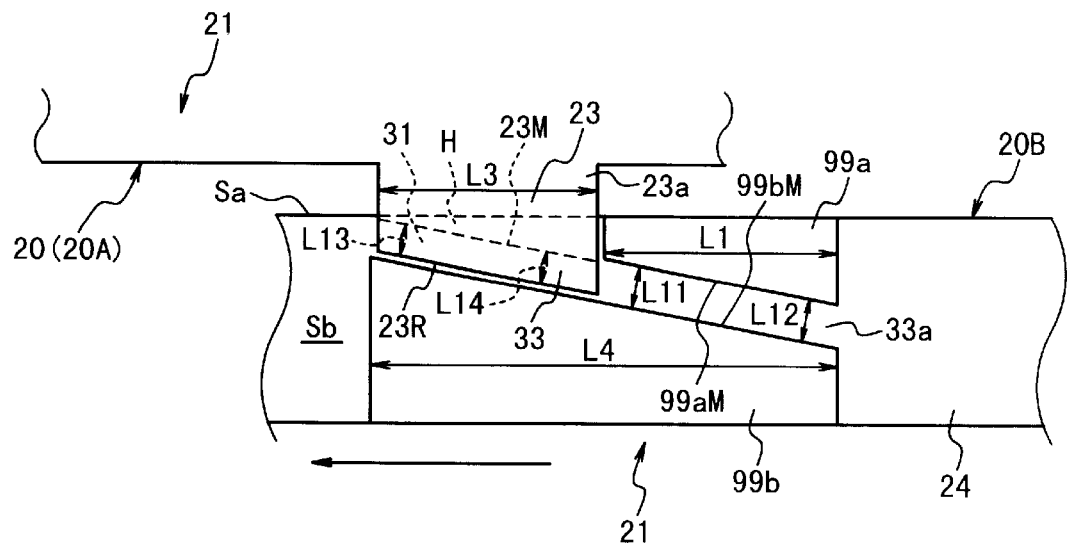
FIGS. 9 and 10 are illustrations of the operation of the hook section when it is coupled to its mating part, and show states before and after the coupling is achieved.
Figure 10:
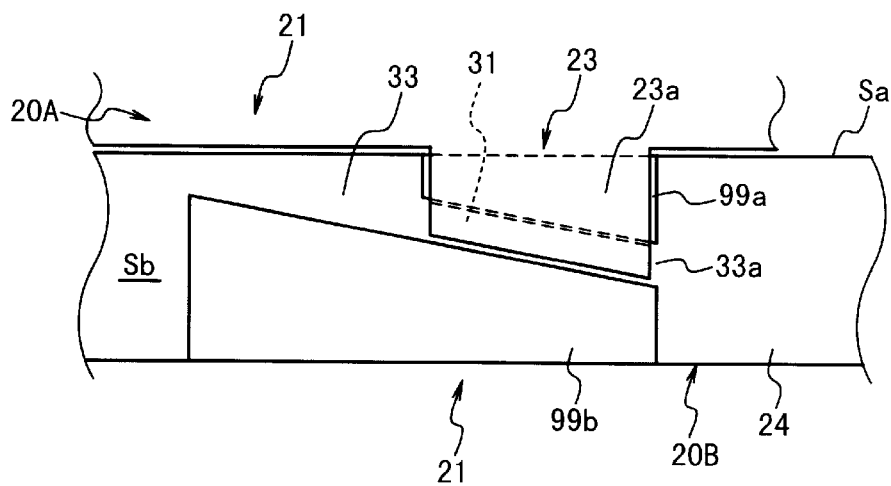
Figure 11:
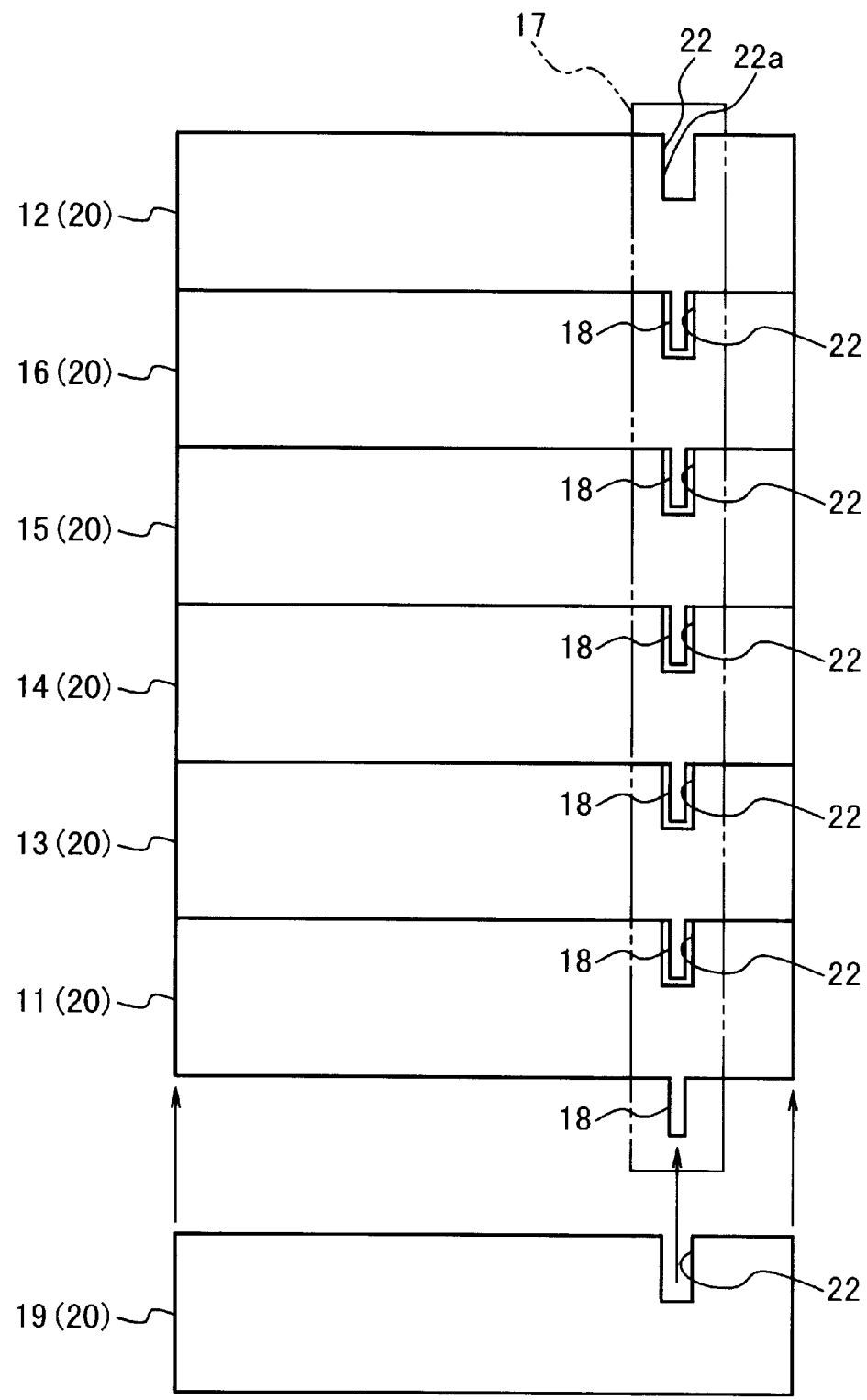
FIG. 11 is an illustration of an interconnection between convex and concave connectors when a plurality of modules as shown in FIG. 5 are coupled together.

FIG. 5 is a perspective view of a multi-stage interconnection type electronic component module with the slidable hook guide member according to an embodiment of the invention, which is effective to form an electronic equipment. FIG. 5 shows a state of the module in which the slidable hook guide member is pulled forward of the module. FIG. 6 is a perspective view of the multi-stage interconnection type electronic component module shown in FIG. 5 when the slidable hook guide member is moved backward of the module. FIG. 7 is a front view of the module when the module is viewed from the direction shown in FIG. 5 by an arrow A. FIG. 8 is a cross section of the module taken along the line B—B shown in FIG. 5. FIGS. 9 and 10 are diagrams to explain the operation of a hook section when it is coupled with a groove in the slidable hook guide member and shows the states before and after the coupling is achieved. FIG. 11 is an illustration of the interconnection between male and female connectors when a plurality of multi-stage interconnection type electronic component modules according to the present invention are adjoined together.

A module 20 in the embodiment of the invention is composed of a module body 21 which internally accommodates one or more electronic components K such as a circuit board, and a slidable hook guide member 24 with respect to the module body 21. The electronic component K may be composed of a CPU board, a CD-ROM unit, a PCNCIA card throttle, a TV tuner, a hard disc unit, a power supply unit or other extension units and is accommodated in the module body 21. One or more CPU boards may be disposed in a single module apart from other. It should be noted that two or more modules 20 are stacked one above another to be used as an electronic equipment, as illustrated in FIG. 11.

As shown in FIG. 5, the module body 21 is in the form of rectangular framework in a plan view. The module body 21 has a front wall, a back wall and side walls Sb. In the present embodiment, the module body 21 may is composed of a metal material such as iron sheet or magnesium alloy or synthetic resin material. Each of the side walls Sb of the module body 21 in a longitudinal direction is formed with a step 21a for arranging the electronic component K thereon. The steps 21a define a part of a lower wall Sd of the module body 21 where the electronic component K are installed. An opening is formed between the steps 21a of the left and right side walls.

A slidable hook guide member 24 provided with a guiding and locking section 33 is in one of the upper and lower portions of each side walls Sb of the module body 21, e.g., in the upper portion in the present embodiment. A hook section 23 serving as a convex or protruding portion is provided in the other portion of each side wall of the module body 21, e.g., in the lower portion in the present embodiment. In the cross section taken along the line B—B shown in FIG. 5, the slidable hook guide member 24 and the hook section 23 are configured as illustrated in FIG. 8. As shown in FIG. 9, the guiding and locking section 33 in the slidable hook guide member 24 includes a groove 33a formed between an upper guide 99a and a lower guide 99b to be described later.

In the present embodiment, a plurality of pairs of guiding and locking sections 33 having a groove 33a and hook section 23 having a hook 31 are provided in each side wall Sb. As shown in FIGS. 5 and 6, two pairs of guiding and locking section 33 and hook section 23 are arranged at two locations in each of the left and right side walls Sb of the module body 21 in this embodiment. The guiding and locking section 33 and the hook section are provided on the upper and lower portions of each side wall Sb in the present embodiment, respectively. As the slidable hook guide member 24 is slid, each guiding and locking section 33 is moved forward or backward of the module body 21.

The hook section 23 is fixedly connected to the lower wall Sd of the module body 21 in a depending manner. In FIGS. 5 and 9, a reference symbol L3 represents a length of the hook section 23 in the longitudinal direction of the module body 21. As shown in FIG. 8, the bottom of the hook section 23 is provided with a hook 31 extending outward. As illustrated in FIG. 5, a pair of hook sections 23 is mounted on the lower wall Sd to have a given spacing in the longitudinal direction.

Referring to FIG. 9, the hook section 23 is generally trapezoidal in shape in side elevation. The hook section 23 includes a hook body 23a and the hook 31. The hook 31 defines a canted side of the trapezoidal hook body 23a and is engaged with the slidable hook guide member 24 of another module 20B. The trapezoidal configuration of the hook section 23 includes vertical shorter and longer sides parallel to each other. The shorter side is located on the front side and the longer side is located on the back side. The hook 31 is generally in the form of a flat plate, which extends outward from the canted side of the trapezoidal shape of the hook section 23 into a direction perpendicular to the hook body 23a.

As shown in FIG. 8, a rail 21b is formed on the upper portions of the side walls Sb of the module body 21 in the longtudinal direction to allows a relative sliding movement of the slidable hook guide member 24 with respect to the module body 21. As seen from FIG. 5 and 8, the front and back walls of the module body 21 are formed higher than each side wall Sb of the module body 21. In addition, each of the front and back walls of the module body 21 has a greater wall thickness than the side wall Sb in the longitudinal direction. In particular, the front wall has a greater wall thickness.

Referring to FIGS. 5 and 7, the front wall of the module body 21 has an upper surface Sa of each of the front and back walls, and a pair of concave or indented aligning pin receivers 26 are formed in the upper surface Sa adjacent to opposite lateral ends. Also, a slot 22a is formed between the pair of aligning pin receivers 26 in the upper surface Sa of the back wall to extend along the back wall. female connector or a concave connector 22 is formed within the slot 22a.

Referring to FIGS. 5 and 7, a pair of aligning pins 25 is provided to project downward from a lower surface of each of the front and back walls Sd of the module body 21 at locations corresponding to the aligning pin receivers 26, i.e., at locations directly below the aligning pin receivers 26. Each aligning pin 25 is sized in such a manner that it can be inserted into the aligning pin receiver 26 of another module 20B. A male connector or a convex connector 18 is formed to project downward from the lower surface Sd of the back wall extending along the back wall of the module body 21 at a location directly below the female connector 22 (or slot 22a). The male connector 18 and the female connector 22 define terminals of a signal bus to which the electrical component K of the module body 21 is connected.

As shown in FIG. 7, the hook section 23 projects further downward from the lower surface Sd of the module body 21 than the male connector 18. As a result, an electrode section formed on the lower end of the male connector 18 can be prevented from contacting a desk surface not so as to be damaged, when the module 20 is placed on the desk surface. Alternatively, the projection of the aligning pins 25 may be chosen to be longer than that of the male connector 18.

As shown in FIG. 5, the slidable hook guide member 24 is formed to have a U-shaped section extending along the side walls and back wall of the module body 21 in plan view. The slidable hook guide member 24 is provided with a slidable handle 24*a* along its open side. As shown in FIGS. 5 and 6, the slidable hook guide member 24 can be slid forward and backward into the direction along the side wall Sb of the module body 21. At this time, the slidable hook guide member 24 is slid along the rails 21*b* on the side walls Sb of the module body 21.

As shown in FIG. 5, the slidable handle 24*a* is formed to have a U-shaped section along the front wall and a part of each side wall. The slidable handle 24*a* is attached to the opposing ends of the slidable hook guide member 24 at the open sides of the slidable hook guide member 24. As shown by an arrow N in FIG. 5, the slidable handle 24*a* is supported to be turnable through at least 90 degrees.

In a normal use state of the module 20, the slidable handle 24 depends down and is received in a step formed on the front side of each of the side walls Sb of the module body 21 in a flush manner with the side wall surface. When the slidable hook guide member 24 is to be slid, the slidable handle 24*a* is turned upward through 90° to its erected position (see FIG. 5). In the erected position, the slidable handle 24*a* extends in the front direction of the slidable hook guide member 24 or in a horizontal direction. Then, the slidable handle 24 is grasped and pushed backward. Thus, the slidable hook guide member 24 can be slid into a back direction or into the right direction in FIG. 5. When the slidable hook guide member 24 is slid to the back end position as shown in FIG. 6, the slidable handle 24*a* is engaged with the front wall of the module body 21, whereby the slidable handle 24*a* is held in its erected position without being turned down.

Referring to FIGS. 5 and 9, two pairs of upper guide 99*a* and lower guide 99*b* are provided on an inner wall of each slidable hook guide member 24. A groove 33*a* is formed between the upper guide 99*a* and lower guide 99*b* to receive the hook 31 of the hook section 23 such that the hook section 23 can be engaged with the slidable hook guide member 24.

The upper guide 99*a* is substantially trapezoidal in shape in side elevation, and has substantially the same shape and size as the hook body 23*a*. In particular, as shown in FIG. 10, the canted side surface or lower surface of the upper guide 99*a* is formed in parallel to the canted side or upper surface of the hook 31 of the hook section 23. The upper guide 99*a* has a length L1 in the sliding direction, and is chosen to be slightly longer than a corresponding length L3 of the hook section 23 in the sliding direction. As shown in FIG. 9, the shorter side of the upper guide 99*a* is in the position on the right side of the hook section 23, when the hook section 23 is disengaged from the upper guide 99*a*.

It could be seen that the upper guide 99*a* is fixedly mounted on the slidable hook guide member 24 in the position directly above the hook section 23. Therefore, the upper guide 99*a* is completely free from the hook section 23 when the hook section 23 is disengaged from the upper guide 99*a* as shown in FIGS. 6 and 9.

As shown in FIGS. 9 and 10, the lower guide 99*b* is substantially trapezoidal in shape in side elevation. The lower guide 99*b* has the longer and shorter sides parallel to each other on the front and back sides. This is substantially opposite from the hook section 23. The canted side of the lower guide 99*b* and the canted side of the hook section 23 (or hook 31) and the canted side of the upper guide 99*a* are formed to be substantially parallel to each other. The shorter side of the lower guide 99*b* is formed at a location in which the longer side of the upper guide 99*a* is formed.

Referring to FIG. 10, the groove 33*a* is formed between the canted side of the upper guide 99*a* and the canted side of the lower guide 99*b* to allow the hook 31 to pass therethrough when the hook section 23 is engaged with the upper guide 99*a*. When the hook section 23 is completely engaged with the upper guide 99*a*, the longer side of the hook section 23 is located slightly to the left of the shorter side of the lower guide 99*b* in the figure. The lower guide 99*b* has a length L4 in the sliding direction of the slidable hook guide member 24, which is approximately twice the length L3 of the hook section 23. As shown in FIGS. 9 and 10, the length L4 of the lower guide 99*b* is sufficient to cover the entire region of the engaging movement of the hook section 23. The length L4 of the lower guide 99*b*, the length L3 of the hook section 23 and the length L1 of the upper guide 99*a* are related such that L4 is greater than the sum of L1 and L3.

In this manner, the canted side of the lower guide 99*b* is effective to guide the relative movement of the hook section 23 when the slidable hook guide member 24 is slid, thus assuring that the smooth engagement and disengagement are carried out.

As shown in FIG. 9, the canted side of the lower guide 99*b* has a length which is sufficient to cover the entire length of the canted side (hook 31) of the hook section 23 when the disengagement is carried out. Thus, the effects performed by the lower guide 99*b* are enhanced to guide the hook section 23. As shown in FIG. 10, the canted side of the lower guide 99*b* has a length which is sufficient to cover the entire length of the canted side (hook 31) of the hook section 23 upon completion of the engagement. Thereby, the lower guide 99*b* is effective to secure the hook 31 in the groove 33*a* so that the hook 31 may be held between the lower guide and the upper guide 99*a* to prevent rattling between the upper module 20 (20A) and the lower module 20 (20B).

As shown in FIGS. 9 and 10, the hook section 23 is formed with a first engaging surface 23M to oppose the upper guide 99*a*. The upper guide 99*a* is formed with a second engaging surface 99*a*M to oppose the hook section 23. The first engaging surface 23M and the second engaging surface 99*a*M are formed on the canted surfaces, respectively. Therefore, the first engaging surface 23M gradually descends as the slidable hook guide member 24 is slid in a direction from right to left as shown in FIGS. 9 and 10 such that the hook section 23 is engaged with the upper guide 99*a*.

On the back side of the first engaging surface 23M of the hook section 23, there is provided a first sliding surface 23R which extends substantially parallel to the first engaging surface 23M. A second sliding surface 99*b*M is formed on the lower guide 99*b* to extend substantially parallel to the first sliding surface 23R of the hook section 23. A space 33*a* between the second engaging surface 99*a*M and the second sliding surface 99*b*M may be formed to have a width which gradually decreases in a direction from the shorter side of the upper guide 99*a* to the longer side thereof, as represented with relation of L11>L12. As a result, a wedging effect is accomplished or the force of engagement increases as the slidable hook guide member 24 moves relative to the module body 21 such that the hook section 23 is engaged with the upper guide 99*a*.

The slidable hook guide member 24 is also formed with the second sliding surface 99bM which is substantially parallel to the second engaging surface 99aM, as described above. The first sliding surface 23R is formed on the back side of the first engaging surface 23M of the hook section 23. The spacing between the first surface 23R and the first engaging surface 23M gradually increases in the engagement of the hook section 23 with the slidable hook guide member 24, as represented with a relationship of L13>L14 in FIGS. 9 and 10. As a result, a wedging effect is accomplished or the force of engagement increases as the slidable hook guide member moves relative to the module body 21 such that the hook section 23 is engaged with the upper guide 99a.

In FIGS. 9 and 10, the difference between the shorter side and the longer side in the upper guide 99a in the vertical direction is a distance by which the modules 20 move toward or away from each other as the slidable hook guide member 24 is slid.

At the same time as the module 20A and module 20B are moved toward or away from each other, a connection or a disconnection between the male connector 18 of the module 20A and the female connector 22 of the module 20B is carried out. At the same time as the module 20A and the module 20B move toward or away from each other, the aligning pins 25 of the module body 21A move into or out of the aligning pin receivers 26 as the guiding and hook sections of the module body 21B.

Referring to FIG. 5, the space H (the length of which is indicated with a reference symbol L2 in FIG. 5) between the upper guides 99a gives a space which the hook section 23 may be inserted into or removed from, as illustrated in FIG. 9. Thus, the length L2 of the space H between the adjacent upper guides 99a is chosen to be greater than the length L3 of the hook section 23.

As mentioned previously, the hook sections 23 are provided at the four locations in the lower portion of the side wall of the module body 21 and are disposed directly below the guiding and locking sections 33. The hook 31 is formed at the end of hook section 23 and is canted in conformity to the groove 33a in the guiding and locking section 33 as shown in FIG. 9. In the present embodiment, it is formed integrally with the hook section 23.

As shown in FIG. 9, the height by which the hook section 23 projects from the module body 21 corresponds to and is substantially equivalent to the height of the longer side of the upper guide 99a of the slidable hook guide member 24. Also, the hook section 23 has the width L3 in the sliding direction which is slightly less than the opening length L2 of the guiding and locking section 33 of the slidable hook guide member 24.

The hook 31 is formed on the end of the hook section 23 and has the length L3 in the sliding direction, which is chosen to be equal to the length L1 of the upper guide 99a of the slidable hook guide member 24, as shown in FIG. 9. Also, the hook 31 has a thickness which is slightly thinner than the width of the groove 33a formed in the guiding and locking section 33 of the slidable hook guide member 24.

The slidable hook guide member 24 is provided in the upper portion of the module body 21 and extends into the sliding direction. Referring to FIG. 9, the lower guide 99b has a length L4, which is chosen to be approximately twice the length L1 of the upper guide 99a, and is located to be elongate forward of the module body 21.

Referring to FIG. 5, the slidable handle 24a is formed of a plate member and may be contained below the module body 21 or project forward of the slidable hook guide member 24. With reference to FIGS. 5 and 6, it could be understood that when the slidable handle 24a is pulled forward to slide the slidable hook guide member 24 forward, the hook section 23 is positioned in the notch between the upper guides 99a, as shown in FIG. 5. On the other hand, when the slidable handle 24a is pushed back to slide the slidable hook guide member 24 backward, the hook section 23 is positioned in the groove 33a, as shown in FIG. 6.

The aligning pin receivers 26 are disposed at the four corners of the module body 21. The aligning pins 25 are disposed directly below the aligning pin receivers 26 in the lower wall of the module body 21. Each of the aligning pins 25 has a length which is shorter than the depth of the aligning pin receiver 26.

Referring to FIG. 7, it would be seen that the male connector 18 projects downward at a location directly below the female connector 22, and has a layout of signal lines (or electrodes) which is the same as the layout on the female connector 22. As mentioned previously, the female connector 22 and the male connector 18 define one end and the other end of a single signal bus, to which the electronic component K is connected, thus allowing a power supply and a transmission of various signals through the signal bus.

In the present embodiment, in the viewpoint of a recycle or disposal, the number of parts is minimized, and the hook section 23 and the aligning pins 25 are formed of a single material and various parts are formed to a common size using a recycle ABS resin. A metal material such as aluminium and magnesium alloy may be used. The slidable hook guide member 24 is also formed of the same material.

The operation of the embodiment will now be described with reference to the drawings.

There are provided a pair of modules 20 which incorporate electronic components K having different functions. One of the modules is disposed on top of the other module 20. In the description to follow, the upper module will be referred to as "module 20A" while the lower module 20 will be referred to as "module 20B". Parts of each module 20 are similarly designated. For example, the slidable hook guide member of the module 20A will be referred to as "slidable hook guide member 24A" while the slidable hook guide member 24 of the module 20B will be referred to as "slidable hook guide member 24B".

Initially, the slidable hook guide member 24B of the lower module 20B is slid backward as shown in FIG. 6. The sliding movement is carried out until the slidable handle 24aB abuts against the front wall of the module body 21b and cannot be moved any further. At this time, the spacing HB of the slidable hook guide member 24B is located directly above the hook section 23B of the module body 21B.

In this state, the module 20A is placed on top of the module 20B. The alignment between the modules 20B and 20A is carried out in the manner mentioned below. Specifically, the aligning pins 25A of the module 20A are inserted into the positioning pin receivers 26B of the module 20B while the male connectors 18A of the module 20A is inserted into the slot 22aB of the module 20B. As a result, the hook 31A of the hook section 23A of the module 20A moves through the spacing HB of the slidable hook guide member 24B of the module 20B into a space above the lower guide 99bB, as shown in FIG. 9.

In the state illustrated in FIG. 9, the male connector 18A of the module 20A has not advanced deep into the slot 22aB of the module 20B. Also, the base ends of the aligning pins 25A of the module 20A have not been complete received into the aligning pin receivers 26B of the module 20B. Only the free ends of the aligning pins 25A are received to certain depths into the aligning pin receivers 26B.

Subsequently, the slidable handle 24aB is operated to cause the slidable hook guide member 24B forward, as indicated by an arrow in FIG. 9 or to the left as shown in FIG. 5. Consequently, the slidtable hook guide member 24B is slid such that the hooks 31A of the module 21A are located within the groove 33aB, whereby the hook sections 23A are gradually pushed downward as shown in FIG. 9.

The aligning pins 25A are progressively inserted into the aligning pin receivers 26B, and the female connector 22B is gradually connected with the male connector 18A. In this manner, the lower module body 21B of module 20B and the upper module body 21A of module 20A move closer to each other.

As the slidable hook guide member 24B is further slid to the left by an amount corresponding to the length L1 of the upper guide 99aA from the position shown in FIG. 9, the state shown in FIGS. 5 and 10 is reached. The stroke when the slidable hook guide member 24B is slid can be determined by the abutment of the slidable hook guide member 24B against the back wall of the module body 21B.

The hook 31A of the hook section 23A then reaches a terminal position of the groove 33a, as shown in FIG. 10. As a result, the upper module body 21A abuts against the lower module body 21B under a given pressure, and also the female connector 22B and the male connector 18A are completely connected and secured together. At this time, the aligning pin 25A is inserted to a given depth into the aligning pin receiver 26B.

When the female connector 22B of one module body 21B is connected with the male connector 18A of the other module body 21A, the signal bus is extended, allowing a cooperation between the electronic component K in one module 20A with the electronic component K of the other module 20B.

FIG. 11 shows a plurality of modules 20 which are interconnected to form a multiple stage electronic equipment.

When a CPU module 12 (20), a CD-ROM module 16 (20), a PCMCIA card throttle module 15 (20), a TV tuner module 14 (20), a hard disk module 13 (20), a power supply module 11 (20) and like are interconnected in a multi-stage manner, the signal bus is extended through the connectors 18, 22 of the respective modules 20 to define a common bus 17. A resulting freedom of signal transmission between the respective modules 20 allows functions such as multi-media personal computer to be realized.

Whenever a new module 20 is developed, it may be interconnected as an extended module 19 (20) such as a floppy disc unit, an additional ROM unit, a sound board, an Internet board, SCSI board, an accelerator board or the like, the extension of the signal bus and its cooperation with other modules can be immediately realized.

If the external addition of the respective module bodies 21 is performed, there is no need to provide a separate casing which contains all of the modules 20, and the assembly can be directly used on a table top as a computer system. In this instance, it is desirable to provide a module mount for the lowermost module 20.

When the function of a certain module 20 becomes unnecessary, or when a particular module is to be removed or changed because a substitute module 20 of a higher performance is available, the slidable handles 24a of the module 20 to be removed and another module which is disposed directly below the module to be removed are operated. As a result, their slidable hook guide members 24 are slid in the direction of the disengagement, and the connection between the male connector 18 and the female connector 22 is then automatically disconnected. Thus, the module to be removed can be removed immediately.

In this manner, in the multi-stage interconnection type electronic component module 20 of the present embodiment, the coupling between the groove 33a of the guiding and locking section 33 and the hook 31 of the hook section 23 can be achieve. Also, the engagement between the hook section 23 and the upper guide 99a can be accomplished. Thereby, a module 20 containing the electronic component K can be brought directly into an abutting relationship with another module under a given pressure and to achieve an electrical connection therebetween. When the coupling is released, the electrical connection between the modules 20 is also disconnected. Thus a removal of particular electrical component is facilitated without the use of any tool.

A common procedure may always be used to remove any electrical component K. Because the modules 20 are coupled together in the form of a stack, the space requirement is reduced. However, it should be understood that the layout is not limited to those shown in the embodiment, but that the individual modules may be connected together in the lateral direction rather than in vertical stack.

Because the engagement is carried out by the movement of a slidable hook guide member 24, a particular module 20 can be removed with little labor if a number of modules 20 are connected together as a stack.

It will be appreciated that the alignment between the hook section 23A and the guiding and locking section 33B when connecting two modules 20A, 20B together is greatly improved in comparison to the conventional technique. Specifically, by operating the slidable handle 24aB to slide the slidable hook guide member 24B backward, it is easy to define the guiding and locking section 33B at a given position within the module 20B. The module 20A on which the hook section 23 is fixedly mounted is then aligned with the module 20B in which the guiding and locking section 33B is defined at the given position. Initially, the module 20A is positioned in the horizontal direction relative to the module 20B.

During the positioning in the horizontal direction, it should be noted that this is carried out while the male connector 18A of the module body 21A is inserted into the slot 22aB of the module body 21B. If such an operation is attempted, the electrodes of the male connector may abut against the edge or the inner wall of the slot 22aB to be damaged. Instead, the positioning is carried out by utilizing the aligning pins 25A and the aligning pins receivers 26B. While the aligning pins 25A are not inserted deep into the aligning pin receivers 26B at this time, the positions at the four corners of the module bodies 21A and 21B in the horizontal direction are roughly determined. This allows the hook section 23A fixedly mounted on the module body 21A to be disposed at a given position in the horizontal direction with respect to the guiding and locking section 33B of the module 20B.

The alignment or positioning for achieving a connection between the male connector 18A of the module body 21A and the female connector 22B is not achieved only by the positioning in the horizontal direction mentioned above. The accurate positioning in the vertical direction will be described below.

A combination of the function of the lower guide 99bB to guide the hook section 23A and the function of the groove 33aB to allow the hook 31A to move into the groove 33a between the lower guide 99bB and the upper guide 99aB allows the alignment between the male connector 18A and the female connector 22B. Then, a simple operation which is free from any likelihood of involving a mistake of sliding the slidable hook guide member 24B along the rail 21bB of the module body 21B is all that required to achieve a reliable contact between the male connector 18A and the female connector 22B with a given pressure of contact.

The module bodies 21A, 22B move toward each other so that the connectors 22B, 28A are connected, as a result of the sliding movement of the slidable hook guide member 24B. Therefore, the likelihood of producing a poor contact between the connectors 22B, 18A is eliminated. The reason will be described. The axes of the aligning pin 25A and the aligning pin receiver 26B are chosen to be coincident in the direction in which the both connectors 18A, 22B are connected or in the vertical direction. As a result, the both module bodies 21A, 21B or both connectors 18A, 22B move toward each other. Accordingly, it is assured that the connectors 18A, 22B move toward each other without deviating from a given direction in which they are to be connected, thus achieving a reliable contact therebetween.

It will be apparent from the foregoing that the occurrence of the poor contact between the connectors 18, 22 of the modules 20A, 20B can be positively prevented with an operation which is simple and which is free from the likelihood of a mistake, thus assuring the reliability and the repeatability of the operation. Since the coupling or removal between the modules 20A, 20B and the connection or disconnection between the connectors 18, 22 are carried out simultaneously through a single operation, the operational efficiency is improved.

In addition to facilitating the alignment, when the modules 20 are coupled to each other, the insertion of the aligning pins 25 into the aligning pin receivers 26 provide an increased number of points of connection between the modules 20, thus achieving a stable connection therebetween.

In addition, the provision of a plurality of guiding and hook sections 33 and hook sections 23 allows an abutment between the modules 20 to occur at a plurality of points rather than a single point, contributing to achieving a stable connection between the modules 20. In particular, if a single abutment is relied upon, it will be subject to influences of dimensional error. However, when a plurality of points of abutment are used, any effect of dimensional errors can be absorbed or alleviated, effectively suppressing rattling between the modules 20.

Since the male connector 18 and the female connector 22 are disposed in the vicinity of the guiding and locking section 33 and the hook section 23 to be coupled together, the connection between the connectors 18, 22 is achieved as the modules 20 are connected together while assuring that the connection between the connectors 18, 22 is firmly secured. Thus, the connection between the electronic components K can be accomplished without paying any particular attention to the connection between the connectors 18, 22. Also, a signal transmission with high reliability can be acomplished between the connected modules while excluding any possibility such as a poor contact between the connected connectors 18, 22. The operational efficiency is improved since the connection or removal of the modules 20 and the connection and the disconnection between the connectors 18, 22 take place simultaneously through a single operation.

The guiding and hook sections 33 and the hook sections 23 are provided on the opposite lateral edges of the module body 21, and the connectors 18, 22 are interposed between the side walls. Therefore, the connection between the connectors is secured with a good balance with respect to the both sides, resulting in positively preventing the occurrence of a poor contact.

When the connection between the connectors 18, 22 is achieved, a signal bus is extended through the respective modules 20. Thus, the cooperation between the electrical components K contained in the respective modules can be implemented in a computer system or the like. An external cable connection of the module body 21 is avoided, and no wiring space is required. The casing can be reduced in size, the space requirement may be reduced or casing which encases all of the modules 20 can be dispensed with.

As a consequence, it is possible to reduce unnecessary parts such as chassis parts or casing parts, allowing a reduction in the cost required. An automatic extension of the signal bus across the modules 20 eliminate the need for securing a space in an anticipation of the addition in a product planning stage. Thus, the omission of a wasteful space and parts can be attempted, contributing to a further reduction in the space requirement and the cost required.

If a substitute part having a higher performance is developed for part of the system, only a corresponding module 20 to that part may be substituted. Thus, it can be prevented that the parts having no relation must be discarded because of the structural limitation. In this manner, the useful life of various parts can substantially be extended as viewed from the entire system.

The provision of the slidable handle 24a associated with the slidable hook guide member 24 facilitates a sliding operation of the slidable hook guide member 24 without involving the likelihood of a mistake.

It should be understood that multi-stage interconnection type electronic component module according to the invention is not limited to the embodiment specifically disclosed above. The present invention may be applied to any interconnection of modules in which the module bodies are connected together by the engagement between a groove in a concave portion and a projection on a convex portion. For example, a groove may be formed in the surface of a hook section while a rib may be formed on the slidable hook guide member.

In this respect, referring to FIG. 9, the provision of the lower guide 99b may be avoided. For example, a substantially C-shaped groove is formed along the sliding direction to have the opens downward in the lower surface or the engaging surface of the upper guide 99a. On the other hand, a substantially circular rib may be formed in the sliding direction, in the upper surface or the engaging surface of the hook 31. With this modification, the substantially circular rib engages the substantially C shaped groove, preventing an offset in either horizontal or vertical direction. In this instance, when each of the groove and the rib is formed to present a gradually decreasing width in the backward direction, as viewed in the sliding direction, or to the right as viewed in FIG. 9, whereby the rib of a reduced width initially moves into the groove in a region having a greater width at the commencement of engagement as shown in FIG. 9 and the clearance therebetween is progressively reduced as the sliding movement proceeds, thus assisting in the coupling operation.

Alternatively, the plate thickness of the hook 31 may be made uniform, rather than changing, as in the embodiment.

On the other hand, the width of the groove 33a may be progressively reduced in the sliding direction. Thus, the coupling force acting between the hook 31 and the groove 33a can increase progressively as the sliding movement proceeds. In this manner, the hook 31 and the groove 33a may function as a wedge. Obviously, the plate thickness of the hook 31 may be increased without changing the width of the groove 33a.

On the contrary to the embodiment, the guiding and locking section may be fixed while the hook section may be slid.

In the present embodiment, the module body 21A and module body 21B are spaced from each other as illustrated in FIG. 9. In this case, the aligning pin 25A of the module body 21A is slightly inserted into the aligning pin receiver 26B of the module body 21B so as to enable a positioning in the horizontal direction. In addition, the length of aligning pin 25A of the module body 21A may be chosen longer than the length of the hook section 23A. As a result, the aligning pin 25A of the module body 21A is slightly inserted into the aligning pin receiver 26B of the module body 21B such that a positioning in the horizontal direction can be accomplished. Therefore, even when the slidable hook guide member 24B of the module 20B is offset to the left, as shown in FIG. 5, the horizontal positioning can be performed. Also, the hook section 23A may be placed on the upper surface of the upper guide 99aB rather than within the spacing H as shown in FIG. 9.

What is claimed is:

1. An electronic equipment including a plurality of modules which are connected together, each of said modules being adapted to contain an electronic component, said electronic equipment comprising:
    a first module of said plurality of modules which has a first engaging portion located along an edge of a long side of said first module and a another first engaging portion located along an edge of an opposing long side of said first module;
    a second module of said plurality of modules which includes a module body and a movable portion which is movable in relation to said module body,
    wherein said movable portion is provided with a second engaging portion and another second engaging portion, said second engaging portion and said another second engaging portion being engaged with said first engaging portion and said another first engaging portion of the first module in response to movement of said movable portion in relation to said module body.

2. An electronic equipment according to claim 1, wherein said first engaging portion is provided in one of upper and lower parts of said first module,
    wherein said second engaging portion is provided in the other of the upper and lower parts of said second module in correspondence with said first engaging portion, and
    wherein said movable portion comprises a first portion interlockingly slidably engaging a rail of said second module along a long side of said second module and another first portion interlockingly slidably engaging another rail of said second module along an opposing long side of said second module.

3. An electronic equipment according to claim 1, wherein a plurality of said first engaging portions are provided in said first module and a plurality of said second engaging portions are provided in said second module.

4. An electronic equipment according to claim 1, wherein at least one of said module body and said first module is formed with a positioning section which positions said module body and said first module.

5. An electronic equipment according to claim 1, wherein said first module is formed with one of a convex portion and a concave portion corresponding to said convex portion, and said second module is formed with the other of said convex portion and said concave portion.

6. An electronic equipment according to claim 5, wherein the convex portion includes of a convex connector connected to an electronic component and said concave portion includes a concave connector connected to another electronic component.

7. An electronic equipment according to claim 5, wherein said convex portion has an amount of projection such that at least part of said convex portion is inserted into said concave portion when said first module is not yet engaged with the movable portion.

8. An electronic equipment according to claim 6, wherein said convex connector is pressed to said concave connector to establish electrical contact with each other when the first module is engaged with said movable portion, and is separated from said concave connector to release the electrical connect.

9. An electronic equipment according to claim 6, wherein one of said first module and said second module on which said convex connector is formed is provided with a projection portion having an amount of projection which is greater than that of said convex connector.

10. An electronic equipment according to claim 1, wherein said movable portion includes a clearance portion into which said first engaging portion can be inserted in said movable portion, and
    wherein said movable portion is moved between a first state in which said first engaging portion is engaged with said second engaging portion and a second state in which said first engaging portion is disengaged from said second engaging portion when said first engaging portion of said first module is inserted into said clearance portion.

11. An electronic equipment according to claim 1, wherein said movable portion is provided with a positioning section which positions said first engaging portion at an engaged position with said second engaging portion.

12. An electronic equipment according to claim 1, wherein said movable portion is provided with a guide section for guiding said first engaging portion between an engaged position with said second engaging portion and a disengaged position from said second engaging portion.

13. An electronic equipment according to claim 1, wherein said first engaging portion is formed with a first engaging surface which opposes said second engaging portions when said first engaging portion and said second engaging portion are engaged, and
    wherein said second engaging portion is formed with a second engaging surface which opposes said second engaging portion when said first engaging portion and said second engaging portion are engaged, and
    wherein each of said first engaging surface and said second engaging surface is formed on a canted surface which progressively descends with the movement of said movable portion.

14. An electronic equipment including a plurality of modules which are connected together, each module containing an electronic component; comprising
    a first module of said plurality of modules which has a first engaging portion; and
    a second module of said plurality of modules which includes a module body and a movable portion which is movable in relation to said module body, wherein said movable portion is provided with a second engaging portion which is engaged with said first engaging portion of the first module in response to movement of said movable portion in relation to said module body, wherein said first engaging portion is formed with a first engaging surface which opposes said second engaging portion when said first engaging portion and said second engaging portion are engaged, and wherein said second engaging portion is formed with a second engaging surface which opposes said first engaging portion when said first engaging portion and said second engaging portion are engaged, and wherein said first engaging portion is formed with a first surface which is substantially parallel to said first engaging surface on a back side of said first engaging surface, and wherein said movable portion is formed with a second surface substantially parallel to said first surface of said first engaging portion when second engaging portion and said first engaging portion are engaged.

15. An electronic equipment according to claim 14, wherein said second surface on said movable portion extends from a position facing said first surface when said first engaging portion is engaged with said second engaging portion to a position facing said first surface when said first engaging portion is disengaged from said second engaging portion.

16. An electronic equipment according to claim 14, wherein a space between said second engaging surface and said second surface has a width which is progressively reduced with the movement of the movable portion relative to said module body.

17. An electronic equipment including a plurality of modules which are connected together, each module containing an electronic component; comprising a first module of said plurality of modules which has a first engaging portion; and a second module of said plurality of modules which includes a module body and a movable portion which is movable in relation to said module body, wherein said movable portion is provided with a second engaging portion which is engaged with said first engaging portion of the first module in response to movement of said movable portion in relation to said module body, wherein said first engagement portion is formed with a first engaging surface which opposes said second engaging portion when said first engaging portion and said second engaging portion are engaged, and wherein said second engaging portion is formed with a second engaging surface which opposes said first engaging portion when said first engaging portion and said second engaging portion are engaged, and wherein said movable portion is formed with a second surface which is substantially parallel to said second engaging surface and which defines, together with said second engaging surface, a clearance through which said first engaging portion can pass, and wherein a first surface is provided on a back side of said first engaging surface of said first engaging surface, and wherein said first surface is formed such that a clearance formed between said first surface and said first engaging surface progressively increases its width with the relative movement of said movable portion relative to the module body such that engaging force is enhanced when said second engaging portion is engaged with said first engaging portion.

18. An electronic equipment according to claim 1, wherein said first module includes a first module body and a first movable portion which is movable relative to said first module body, and wherein said first engaging portion is provided on said first module body of said first module, and wherein said first movable portion on said first module is engageable with a third module.

19. A module engageable with another module, comprising:

a module body adapted for containing an electronic component and a movable portion which is movable relative to the module body; and an engaging portion provided on said movable portion and engageable with another engaging portion provided on said another module, said engaging portion being engageable with and disengageable from the other engaging portion on said other module as said movable portion moves relative to said module body, wherein said movable portion comprises a handle portion and a U-shaped portion connected to ends of said handle portion, said U-shaped portion having two longer sides, said longer sides slidably interconnected to top edges of opposing long sides of said module body.

20. A method of assembling an electronic equipment comprising a plurality of modules interconnected together, each of the modules adapted for containing an electronic component, the method comprising the steps of:

positioning a first module and a second module in the direction of a first surface; and causing a relative movement of a slidable hook guide member of at least one of the first module and the second module relative to the other to position said first module and said second module in the direction of a second surface which is substantially orthogonal to the direction of said first surface, thereby interconnecting said first module and said second module, wherein said relative movement step causes said slidable hook guide member to simultaneously slide along opposing side edge surfaces of said at least one of the first module and the second module along interlock guidepaths on each of said opposing side edge surfaces.

* * * * *